(12) United States Patent
Radhakrishnan et al.

(10) Patent No.: US 7,173,804 B2
(45) Date of Patent: Feb. 6, 2007

(54) ARRAY CAPACITOR WITH IC CONTACTS AND APPLICATIONS

(75) Inventors: Kaladhar Radhakrishnan, Chandler, AZ (US); Larry E. Mosley, Santa Clara, CA (US); Dustin P. Wood, Chandler, AZ (US); Nicholas L. Holmberg, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 87 days.

(21) Appl. No.: 10/952,968

(22) Filed: Sep. 28, 2004

(65) Prior Publication Data
US 2006/0067030 A1    Mar. 30, 2006

(51) Int. Cl.
*H01G 4/228* (2006.01)
(52) U.S. Cl. ................... 361/306.1; 361/329
(58) Field of Classification Search ........ 361/303–304, 361/306.1, 306.2, 306.3, 308.1, 328–330; 257/303, 306, 310, 532, 528, 534
See application file for complete search history.

(56) References Cited

U.S. PATENT DOCUMENTS

| | | | | |
|---|---|---|---|---|
| 5,400,948 A | * | 3/1995 | Sajja et al. | 228/180.1 |
| 5,446,960 A | * | 9/1995 | Isaacs et al. | 29/834 |
| 5,880,925 A | * | 3/1999 | DuPre et al. | 361/303 |
| 5,994,183 A | * | 11/1999 | Huang et al. | 438/256 |
| 6,291,884 B1 | * | 9/2001 | Glenn et al. | 257/747 |
| 6,435,893 B1 | * | 8/2002 | Kasahara | 439/342 |
| 6,477,035 B1 | * | 11/2002 | Cepas et al. | 361/306.3 |
| 6,606,237 B1 | * | 8/2003 | Naito et al. | 361/306.3 |
| 6,930,257 B1 | * | 8/2005 | Hiner et al. | 174/262 |
| 2005/0052822 A1 | * | 3/2005 | Shimizu et al. | 361/306.3 |
| 2006/0071341 A1 | * | 4/2006 | Kim et al. | 257/773 |

FOREIGN PATENT DOCUMENTS

JP     07201651 A2   8/1995

* cited by examiner

*Primary Examiner*—Eric W. Thomas
(74) *Attorney, Agent, or Firm*—Schwabe, Williamson & Wyatt, P.C.

(57) ABSTRACT

An apparatus having a first set of contacts on a first side of the apparatus adapted to interface with a corresponding plurality of contacts on an integrated circuit package. The apparatus further includes a second set of contacts on a second side of the apparatus adapted to interface with a corresponding plurality of grid array leads, and a plurality of capacitive storage structures coupled to the first and second sets of contacts.

17 Claims, 4 Drawing Sheets

ARRAY CAPACITOR WITH IC CONTACTS AND APPLICATIONS

FIELD OF THE INVENTION

The present invention relates in general to the field of integrated circuits and, in particular, packaging of integrated circuits.

BACKGROUND OF INVENTION

Packaging of integrated circuits in general has associated with it several functions. Such functions may include providing mechanical support for an integrated circuit device and providing the means of removing heat generated by the integrated circuit. Additionally, the functions may include providing the means for delivery of signals and power to/from the integrated circuit.

A poorly designed package may have negative effects on various aspects of an integrated circuit. For example, while packaging in general cannot add to the performance of a circuit design embodied in an integrated circuit, packaging may have adverse effects on a circuit design's performance. These adverse effects may result, for example, in limiting the maximum frequency at which a processor housed by a poorly designed package may be operated. Another negative effect may be an increase in power that may be consumed by an integrated circuit in a poorly designed package.

BRIEF DESCRIPTION OF DRAWINGS

Embodiments of the present invention will be described referencing the accompanying drawings in which like references denote similar elements, and in which.

DETAILED DESCRIPTION OF THE EMBODIMENTS

Various aspects of illustrative embodiments of the invention will be described using terms commonly employed by those skilled in the art to convey the substance of their work to others skilled in the art. However, it will be apparent to those skilled in the art that alternate embodiments may be practiced with only some of the described aspects. For purposes of explanation, specific numbers, materials, and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

The phrase "in one embodiment" is used repeatedly. The phrase generally does not refer to the same embodiment; however, it may. The terms "comprising", "having" and "including" are synonymous, unless the context dictates otherwise.

Figure 1:
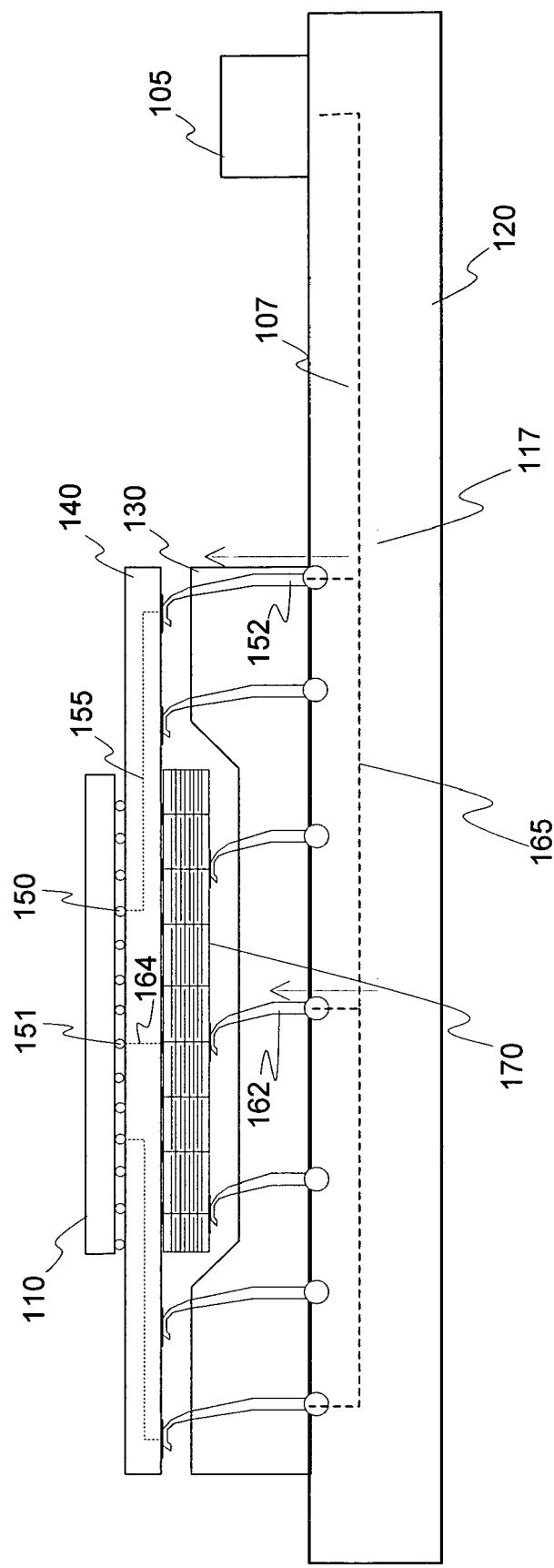
FIG. 1 illustrates a portion of a system utilizing an array capacitor, in accordance with one embodiment.

FIG. 1 illustrates a portion of a system utilizing an array capacitor, in accordance with one embodiment. In this system, a voltage regulator 105 provides power to an integrated circuit 110. The power is routed through multiple paths. These paths include a first path 107 running through a first substrate 120, e.g. a printed circuit board, to a land grid array socket 130, and then, through a prong 152 to a second substrate, e.g. package substrate 140. For the embodiment, this first path 107 is routed through the package substrate 140 in part, horizontally 155, and then to a bump 150 on the integrated circuit 110. In the embodiment illustrated, a second path 117 is also utilized. Second path 117 is routed in part, horizontally 165 in the first substrate 120 for a greater distance than a similar portion of the routing of the first path 107. The second path 117 is then routed to the land grid array socket 130 and through a prong 162 to an array capacitor 170. The second path 117 continues through the array capacitor 170 to the package substrate 140. The second path 117 is routed 164 through the package substrate 140 with little, if any, horizontal component to bump 151 on integrated circuit 110. The first and second paths 107 117 may provide an ability to supply power to the integrated circuit 110, individually or in combination.

Prong 162 may be of different dimension than that of prong 152. This may be to accompany the difference in height between the substrate 140 upon which the land grid array may be mounted and the pads on the package substrate 140 and the pads on the array capacitor 170. Thus, the height of prong 162 may be shorter than that of prong 152 to accommodate the height of the array capacitor 170.

Figure 2:
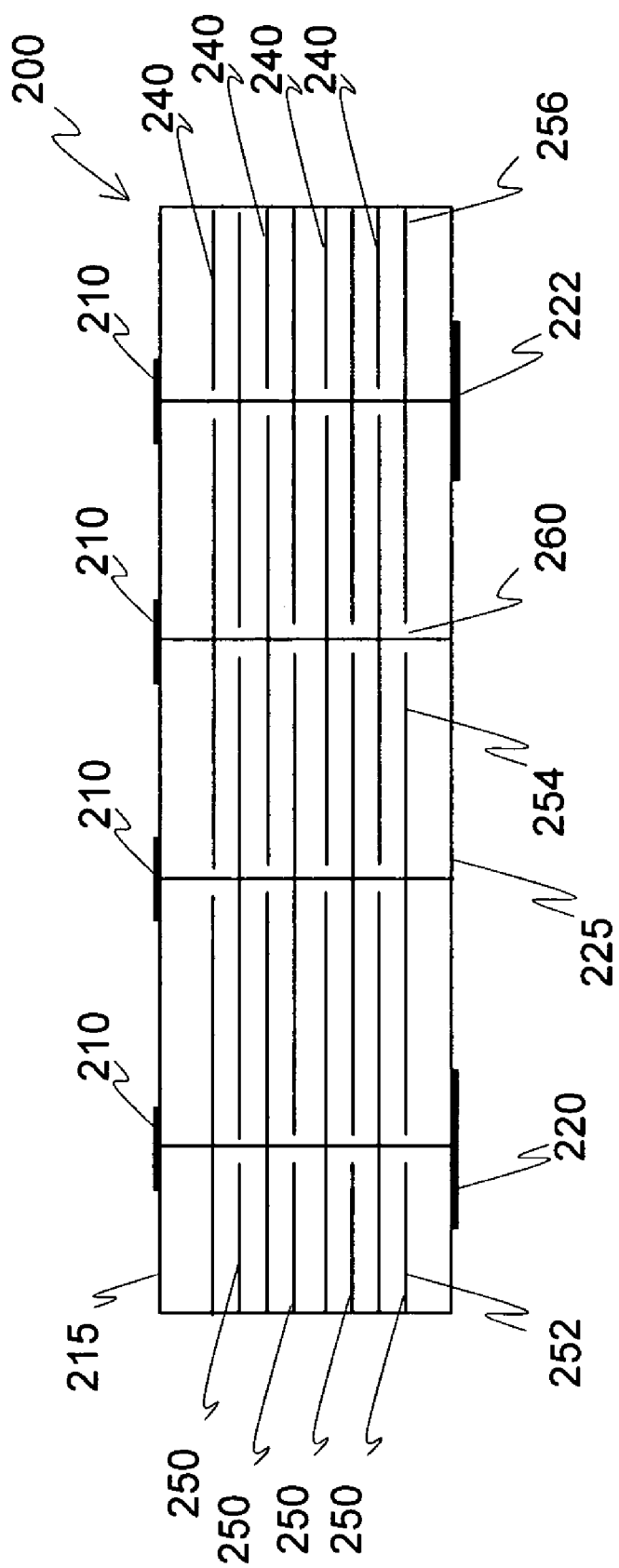
FIG. 2 illustrates a cross sectional view of an array capacitor 200, in accordance with one embodiment.

FIG. 2 illustrates a cross sectional view of an array capacitor 200, in accordance with one embodiment. A first set of pads 210 on a first side 215 of the array capacitor 200 may be utilized as contacts for the array capacitor 200. In this embodiment, the first set of pads 210 may be used to interface the array capacitor 200 to an integrated circuit package. A second set of pads 220 222 on a second side 225 of the array capacitor 200 may also be utilized as contacts for the array capacitor 200. In this embodiment, the second set of pads 220 222 may be used to interface the array capacitor 200 to a socket. For example, the second set of pads 220 222 may be used to interface the array capacitor to a corresponding set of leads on a land grid array (LGA) socket. Note that the number of pads in the first set of pads 210 may be greater than the number of pads in the second set of pads 220 222. This higher number of pads in the first set of pads 210 may reflect a greater density of contacts on the integrated circuit package vis-à-vis the leads of the LGA socket.

The array capacitor 200 comprises capacitive storage elements. In the embodiment illustrated in FIG. 2, the capacitive storage elements of the array capacitor are conductive planes 240 250. When the array capacitor 200 is utilized in a system, for example as illustrated in FIG. 1, a first plurality of the conductive planes 240 may be electrically coupled to a ground voltage. For example, the first plurality of conductive planes 240 may be coupled to pad 220. Pad 220 may interface with a LGA prong that provides a ground voltage. When the array capacitor 200 is placed in a system such as that illustrated in FIG. 1, a second plurality of the conductive planes 250 may be electrically coupled to a supply voltage. For example, the first plurality of conductive planes 250 may be coupled to pad 222. Pad 222 may interface with a LGA lead that provides a supply voltage. For example, a supply voltage may be at a voltage level utilized by an integrated circuit coupled to the array capacitor. Each plane may have vias 260 to allow for interconnection between layers and to allow for connection to the appropriate contact pads. The embodiment illustrated shows one pad 222 which may be utilized for supply voltage and one pad 220 which may be utilized for ground voltage. In various embodiments there may be a greater number of pads which may be utilized for supply voltage and/or pads which may be utilized for ground voltage.

Figure 3:
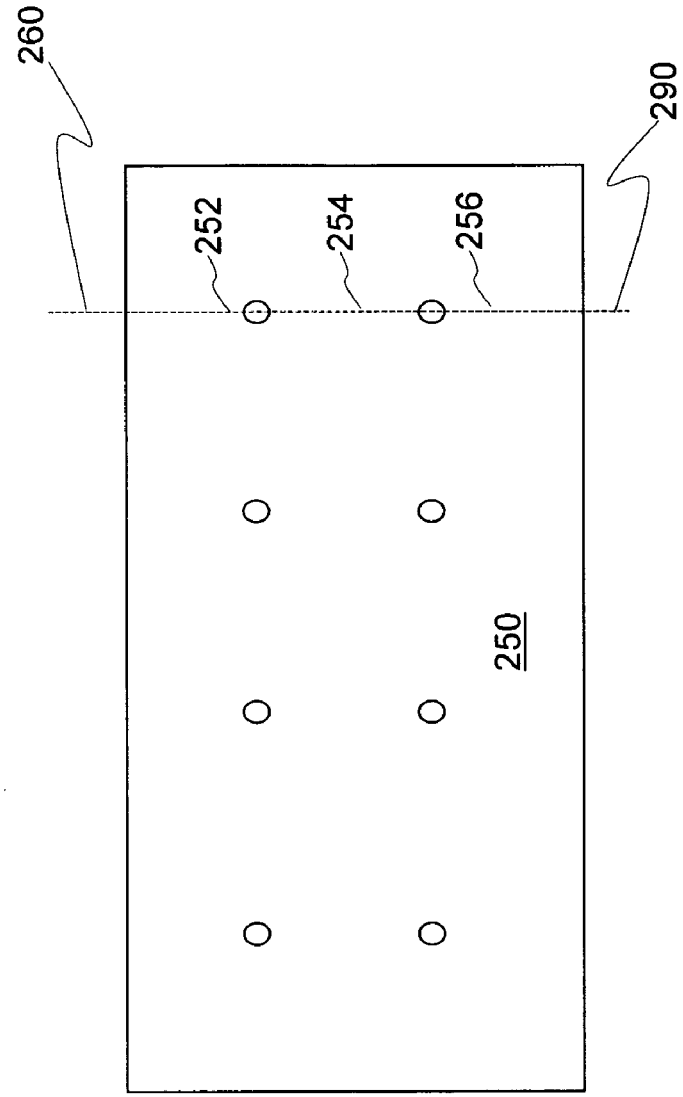
FIG. 3 illustrates a plan view of a conductive plane 250, in accordance with one embodiment.

As previously mentioned, FIG. 2 illustrates a cross sectional view of the array capacitor. However, this two dimensional view may be limiting in illustrating the electrical interconnectedness of portions of a plane. That is, vias 260 in FIG. 2 may provide the false appearance that there is no electrical coupling between conductive plane portions 252–256. FIG. 3 illustrates a plan view of a conductive plane 250, including a cut line 290 showing the cross sectional view of FIG. 2, in accordance with one embodiment. The three sections 252–256 are illustrated at the cut line 290. Thus, it can be seen that, although in FIG. 2 it does not appear that conductive plane portions 252 254 of conductive plane 250 are electrically coupled, they are electrically coupled.

As previously discussed, the addition of the array capacitor may contribute to providing for alternative power paths to the integrated circuit. Refer again to the first path 107 and the second path 117 for the delivery of power to the integrated circuit 110. A substantial portion of the horizontal component of the power delivery for the first path 107 is provided through package substrate 140. This is in contrast with the second path where most, if not all, of the horizontal component of the power delivery is through substrate 120. Package substrate 140 may have routing resources which are limited when compared with the routing resources of substrate 120. Substrate 120 may be, for example, a printed circuit board with routing traces which may be many times wider than routing trace in package substrate 140. This may provide a better ability to facilitate power delivery.

The use of an array capacitor that is closely disposed to the integrated circuit, may provide the ability for the array capacitor to provide current "on-demand" via the capacitive structure of the array capacitor. Referring again to the embodiment illustrated in FIG. 1, the system may be designed such that the array capacitor is situated on the opposite side of the package from the integrated circuit and directly below the integrated circuit. In this way, the distance from the integrated circuit to the array capacitor may be reduced. For example, in one embodiment, the trace distance between leads on an grid array and a bump on the integrated circuit may be only the distance through the package substrate when there is no horizontal component to this trace. This may help in the provision of charge from the array capacitor to the integrated circuit in a shorter period of time. For example, when there is switching in the integrated circuit and there is a current draw on the system, the array capacitor may reduce the time that it takes to provide current to the integrated circuit as compared to the time that the current would take to arrive from a voltage regulator.

In various embodiments the array capacitor may be similarly sized, in various aspects, to that of the integrated circuit. For example, in one embodiment, the array capacitor may be coupled to an area on a bottom side of the package substrate which is the same size as an area on a top side of the package substrate that is occupied by the integrated circuit. In still other embodiments, capacitive capabilities having other capacitive structures may be employed instead.

Figure 4:
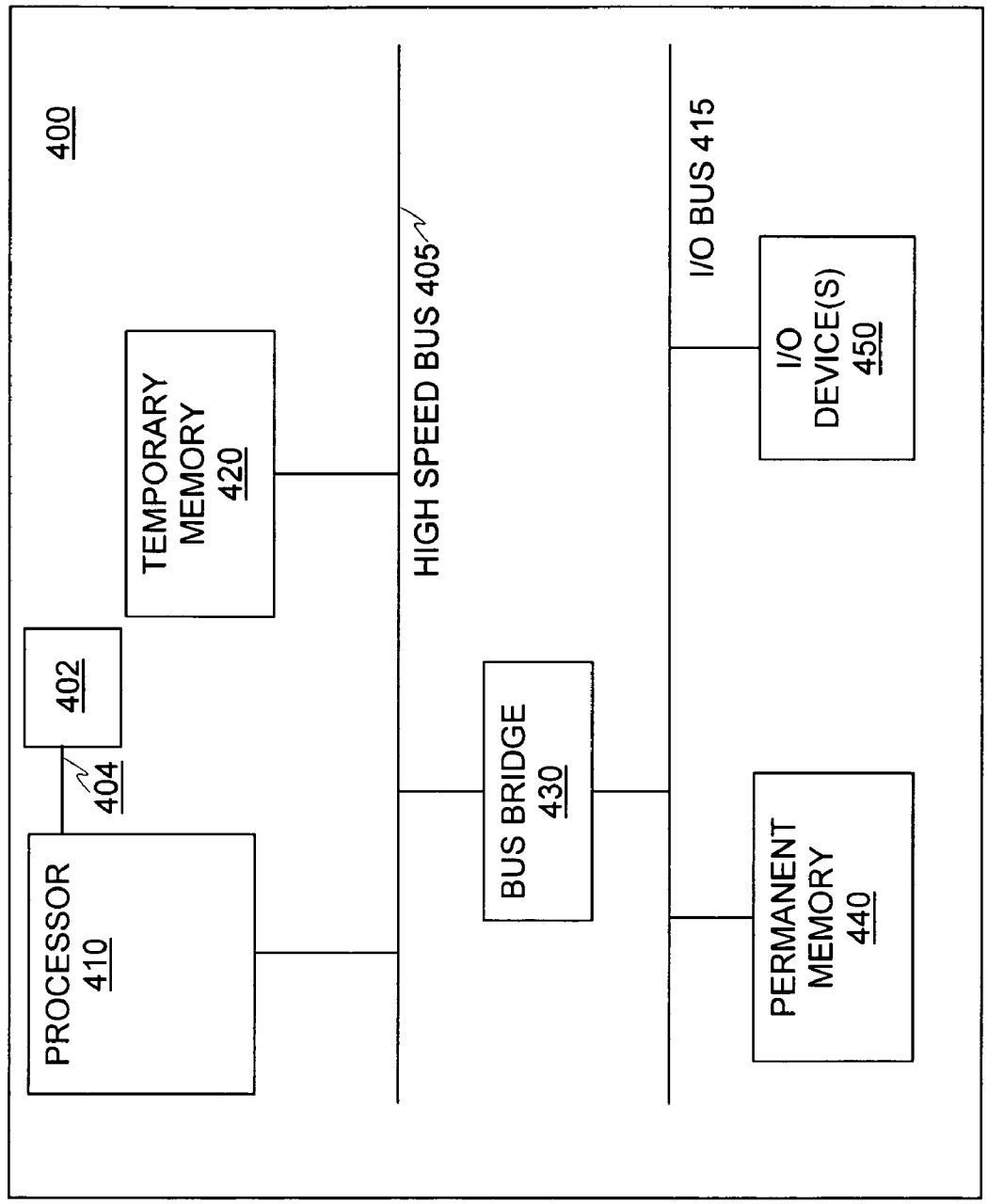
FIG. 4 illustrates is a block diagram of an electronic system 400 including a which may utilized an array capacitor.

FIG. 4 illustrates is a block diagram of an electronic system 400 including a which may utilized an array capacitor. As shown, the system 400 includes a processor 410 and temporary memory 420, such as SDRAM and DRAM, on high-speed bus 405. Voltage regulator 402 may be utilized to provide power to processor 410 via traces 404. The High-speed bus is connected through bus bridge 430 to input/output (I/O) bus 415. I/O bus 415 connects permanent memory 440, such as flash devices and mass storage device (e.g. fixed disk device), and I/O devices 450 to each other and bus bridge 430.

In various embodiments, system 400 may be a hand held computing device, a mobile phone, a digital camera, a tablet computer, a laptop computer, a desktop computer, a set-top box, a CD player, a DVD player, or a server.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. It is to be recognized that other devices may be utilized without deviating from the scope of the embodiments presented herein. This application is intended to cover any adaptations or variations of the embodiments discussed herein. Therefore, it is manifestly intended that this invention be limited only by the claims and the equivalents thereof.

What is claimed is:

1. A apparatus comprising:
    a first plurality of contacts on a first side adapted to interface with a corresponding plurality of contacts on an integrated circuit package;
    a second plurality of contacts on a second side adapted to interface with a corresponding plurality of grid array leads;
    a plurality of capacitive storage structures selectively coupled to the first and second plurality of contacts; and
    wherein the apparatus adapted to couple with a land grid array socket.

2. The apparatus of claim 1 wherein said plurality of capacitive storage structures comprise a first plurality of storage elements and a second plurality of storage elements.

3. The apparatus of claim 2 wherein the first plurality of storage elements comprise a first plurality of conductive planes and the second plurality of storage elements comprise a second plurality of conductive planes.

4. The apparatus of claim 3 wherein the first plurality of conductive planes are electrically interconnected, and the second plurality of conductive planes are electrically interconnected.

5. The apparatus of claim 2 wherein at least one of the second plurality of contacts is adapted to receive a ground voltage and wherein at least one of the second plurality of contacts is adapted to receive a supply voltage.

6. The apparatus of claim 5 wherein the at least one of the second plurality of contacts adapted to receive a ground voltage is coupled to the first plurality of capacitive storage elements.

7. The apparatus of claim 5 wherein the at least one of the second plurality of contacts adapted to receive a supply voltage is coupled to the second plurality of capacitive storage elements.

8. An apparatus, comprising:
    a package substrate;
    an integrated circuit coupled to the package substrate; and an array capacitor coupled to the package substrate, the array capacitor comprising:
a first plurality of contacts on a first side adapted to interface with a corresponding plurality of contacts on the package substrate;
a second plurality of contacts on a second side adapted to interface with a corresponding plurality of grid array leads; and
a plurality of capacitive storage structures selectively coupled to the first and second plurality of contacts; and 9. The apparatus of claim 8 wherein a first subset of land grid array prongs comprise a first dimension and the second subset of land grid array prongs comprises a second dimension wherein the second subset of land grind array prongs are adapted to interface with the second plurality of contacts.

10. The apparatus of claim 8 wherein the integrated circuit is connected to a first side of the package substrate and the array capacitor is connected to a second side of the package substrate wherein the second side is opposite the first side.

11. The apparatus of claim 8 wherein the array capacitor occupies an area on the second side of the integrated circuit substantially equal to an area occupied by the integrated circuit on the first side of the package substrate.

12. A system comprising:
a package substrate;
an integrated circuit coupled to the package substrate;
an array capacitor coupled to the package substrate, the array capacitor comprising:
a first plurality of contacts on a first side adapted to interface with a corresponding plurality of contacts on the package substrate;
a second plurality of contacts on a second side adapted to interface with a corresponding plurality of grid array leads; and
a plurality of capacitive storage structures selectively coupled to the first and second plurality of contacts;
a mass storage device; and
at least one bus coupled between the integrated circuit and the mass storage device to facilitate data exchange between the integrated circuit and the mass storage device; and
a land grid array socket coupled between the array capacitor and the mass storage device.

13. The system of claim 12 wherein said plurality of capacitive storage structures comprises a first plurality of storage elements and a second plurality of storage elements.

14. The system of claim 13 wherein the at least one of the second plurality of contact pads adapted to receive a ground voltage is coupled to the first plurality of capacitive storage elements.

15. The system of claim 13 wherein the at least one of the second plurality of contact pads adapted to receive a supply voltage is coupled to the second plurality of capacitive storage elements.

16. The system of claim 12 further comprising a voltage regulator wherein at least one of the second plurality of contact pads is adapted to receive a ground voltage and wherein at least one of the second plurality of contact pads is adapted to receive a supply voltage from the voltage regulator.

17. The system of claim 12 further comprising:
a substrate coupled between the array capacitor and the mass storage device to provide supply voltage and ground paths to supply power to the integrated circuit by reducing path propagation through the package substrate.

* * * * *

UNITED STATES PATENT AND TRADEMARK OFFICE
CERTIFICATE OF CORRECTION

PATENT NO. : 7,173,804 B2  Page 1 of 1
APPLICATION NO. : 10/952968
DATED : February 6, 2007
INVENTOR(S) : Radhakrishnan et al.

It is certified that error appears in the above-identified patent and that said Letters Patent is hereby corrected as shown below:

Column 2
Line 26, "...substrate 140..." should read --...package substrate 140...--.

Column 3
Lines 30 & 32-33, "...substrate 120..." should read --...first substrate 120...--.

Column 4
Line 30, "1. A apparatus..." should read --1. An apparatus...--.

Claim 8
Col. 5, Line 10 after "of contacts; and" insert --a land grid array socket coupled to the array capacitor--.

Signed and Sealed this

Fourth Day of November, 2008

JON W. DUDAS
*Director of the United States Patent and Trademark Office*